United States Patent [19]

Danley et al.

[11] Patent Number: 4,757,227

[45] Date of Patent: Jul. 12, 1988

[54] TRANSDUCER FOR PRODUCING SOUND OF VERY HIGH INTENSITY

[75] Inventors: Thomas J. Danley, Highland Park; Dennis R. Merkley, Wauconda; Charles A. Rey, Naperville, all of Ill.

[73] Assignee: Intersonics Incorporated, Northbrook, Ill.

[21] Appl. No.: 842,931

[22] Filed: Mar. 24, 1986

[51] Int. Cl.[4] .............................................. H01L 41/08

[52] U.S. Cl. .................................... 310/323; 310/325; 74/1 SS; 181/0.5; 340/384 E

[58] Field of Search ................................ 310/321-326, 310/334, 26; 74/1 SS; 181/0.5; 248/1; 73/505; 239/102; 340/384 E

[56] References Cited

U.S. PATENT DOCUMENTS

| | | | |
|---|---|---|---|
| 3,164,022 | 1/1965 | Ensley | 181/0.5 X |
| 3,357,641 | 12/1967 | Martner | 310/323 X |
| 3,421,939 | 1/1969 | Jacke | 310/325 X |
| 3,882,732 | 5/1975 | Fletcher et al. | 181/0.5 X |
| 3,891,869 | 6/1975 | Scarpa | 310/325 |
| 3,904,896 | 9/1975 | Guntersdorfer | 310/323 X |
| 4,034,244 | 7/1977 | Asai et al. | 310/325 |
| 4,173,725 | 11/1979 | Asai et al. | 310/325 |
| 4,284,403 | 8/1981 | Rey | 181/0.5 X |
| 4,319,716 | 3/1982 | Lauer | 310/323 X |
| 4,368,400 | 1/1983 | Taniguchi et al. | 310/322 |
| 4,402,221 | 9/1983 | Lee et al. | 181/0.5 X |
| 4,402,458 | 9/1983 | Lierke et al. | 310/325 X |

FOREIGN PATENT DOCUMENTS

| | | | |
|---|---|---|---|
| 2029159 | 3/1980 | United Kingdom | 310/323 |

OTHER PUBLICATIONS

Acoustic Field Positioning for Containerless Processing by Whymark, *Ultrasonics*, No. 6, vol. 13, 1975, pp. 251-261.

Acoustic Levitating Apparatus for Submillimeter Samples, by Lee and Feng, *Rev Sci Instrum* 53(6), Jun. 1982, pp. 854-859.

*Primary Examiner*—Mark O. Budd

*Attorney, Agent, or Firm*—Juettner Pyle Lloyd & Verbeck

[57] ABSTRACT

A sound transducer having a high impedance relative to air is coupled with mechanical transformers. The output transformer is in the shape of a dish having the center coupled to a piezoelectric transducer, the outer portion of the dish is unsupported and more flexible than the center section at resonance this allows large amplitude movement and a better impedance match to air.

17 Claims, 2 Drawing Sheets

TRANSDUCER FOR PRODUCING SOUND OF VERY HIGH INTENSITY

BACKGROUND OF THE INVENTION

This invention relates to method and apparatus for producing sound at very high intensities, typically above 160 db, for use in a variety of applications, especially in acoustic levitation devices.

In conventional sound producing devices, a diaphragm or piston may be caused to vibrate in a sound transmitting medium such as air to produce sound waves. One form of transducer used for producing high intensity sounds is referred to as a St. Clair device. In such a device, a resonant, half wavelength matallic stub or bar is electromagnetically driven, which causes the stub to elastically expand and contract in a resonant mode and propagate sound waves away from the ends, and long the axis of the stub. The electromechanical drive may be in the form of discs of piezoelectric material which are firmly compressed between the two parts of the bar.

While the St. Clair sound source if capable of relatively high intensity sound output, i.e., up to 160 db, the design is troubled with problems of low efficiency, large input power requirements, and poor fatigue resistance.

High intensity sound sources are particularly useful for acoustic levitation, in which sound waves are used to suspend or hold an object in position without any other means of support. As described in U.S. Pat. No. 4,284,403, acoustic levitation has been considered most practical for use in space because considerable acoustic power is required to overcome the force of gravity on earth acting on the levitated object. A more efficient and intense source of sound would allow for acoustic levitation of higher density objects on earth, or would allow use of such devices in space with greater reliability and less consumption of electrical power.

SUMMARY OF THE INVENTION

In accordance with the present invention, a sound transducer having a high impedance relative to air is coupled with mechanical transformers, by which the impedance at the final transformer more closely matches the impedance of the air or other sound transmitting medium, and the sound is propagated primarily along or within a beam. The final or output transformer is in the form of a dish having a portion coupled to a vibrating source, with the outer perimeter of the dish being unsupported and preferably thinner and hence more flexible than near the center. This allows the diameter of the dish to be more than several wavelengths of the sound being produced. The dish is caused to flex, with the outer perimeter having a degree of movement or displacement which is many times greater than the movement of the transducer. Unlike prior art sound devices such as loudspeakers which are akin to a high impedance reciprocating piston, the dish-shaped device is capable of elastically flexing in its resonant mode at a relatively large amplitude relative to the amplitude of the transducer, and is more nearly matched to the impedance of the air. The device of the present invention is therefore more efficient than prior art devices, i.e., more than 10 times efficient than a St. Clair device, and can produce more intense sound per unit of input energy.

The use of a flexible dish also causes propagation of a highly directed beam of high intensity sound which may be focused or concentrated, if desired, depending on the shape or configuration of the dish. Because of the focusing effect, the use of the dish also suppresses harmonic generation which would normally occur due to non-linear transmission of sound in air at high intensities. With the use of the dish, the highest intensity occurs only near the focus rather than over an entire radiating surface as in conventional transducers.

THE DRAWINGS

Figure 7B:
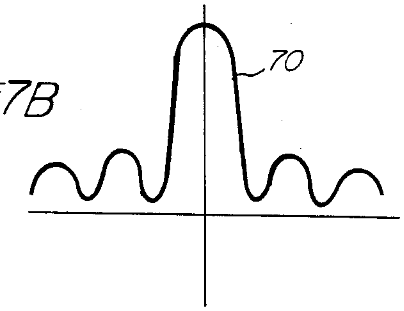
Figure 7A:
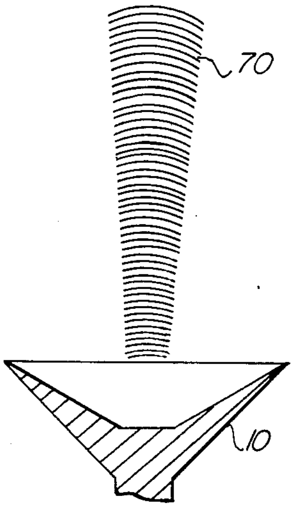

FIG. 7*a* is a side view of a typical sound pattern produced by the transducer of the present invention.

FIG. 7*b* is a graphical representation of the sound pattern shown in FIG. 7*a*.

Figure 8:
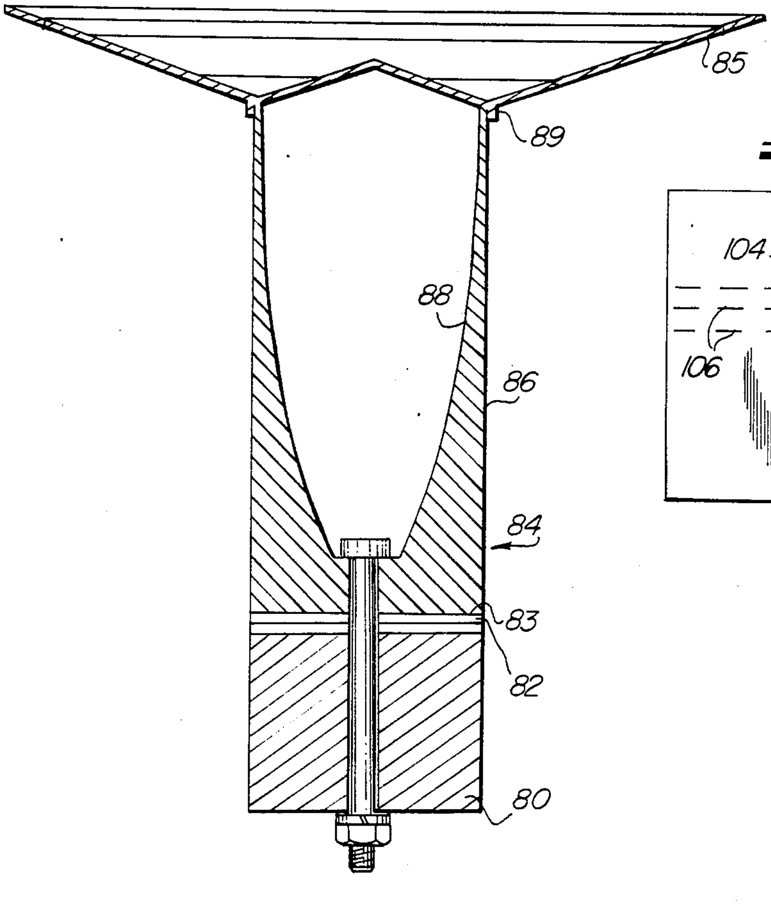

FIG. 8 is a side sectional view of another version of the transducer of the present invention.

Figure 9:
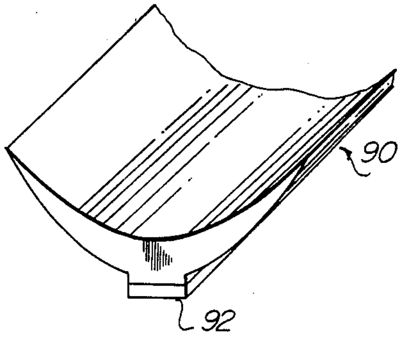

FIG. 9 is a perspective view of yet another version of the transducer of the present invention.

Figure 10:
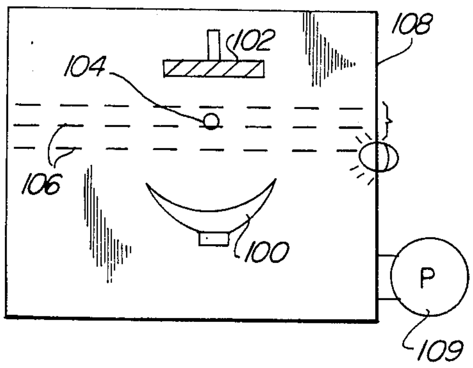

FIG. 10 is a schematic sectional view of the transducer used in an acoustic levitation device.

DESCRIPTION OF THE PREFERRED EMBODIMENTS

Figure 1:
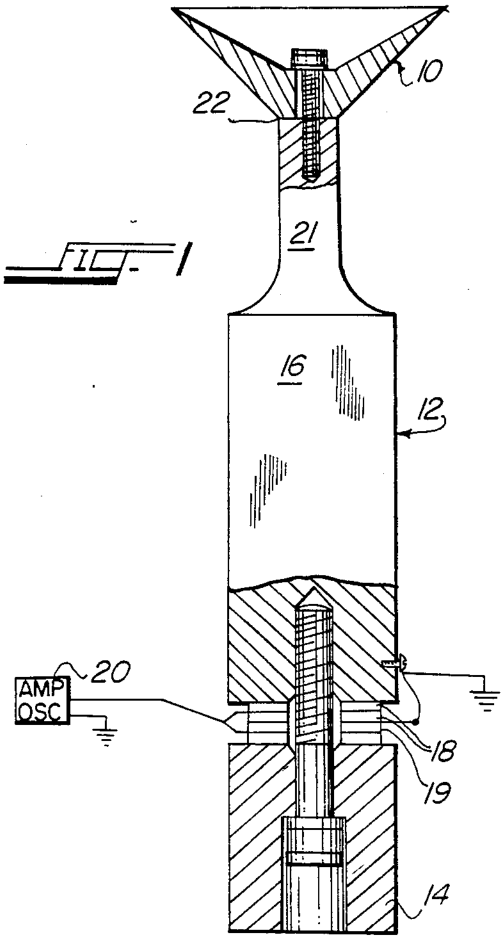
FIG. 1 is a sectional side view of the transducer of the present invention.

As shown in FIG. 1, a hollow concave or flat axisymmetric dish 10 is secured to and axisymmetrically loaded by the output end of a conventional driver 12. The driver 12 comprises a stub or a base 14 and a solid cylindrical metallic piston 16. A plurality of piezoelectric wafers 18 separated by brass discs 19 are secured between the stub 14 and piston 16 and are operatively connected to an amplifier and oscillator, shown schematically at 20 in FIG. 1. Changes of voltage applied across the piezoelectric wafers 18 cause them to expand and contract in unison. This, in turn, causes the metallic piston to elastically deform, with the end 22 thereof moving back and forth at the desired frequency. The piston consists of two portions, as shown, with the portion A adjacent the wafers 18 being of a larger diameter than the portion 21 connected to the dish 10. All of the aforesaid components are secured together tightly along a common axis. The length of the stub 14 and portion 21 is approximately equal to one-quarter wavelength of the sound to be produced, and the length of the portion 16 is about one-half wavelength.

While the use of the driver 12 is preferred, other forms of electromechanical drives may be employed, with the output being in the form of an axially vibrating piston or object connected to the dish 10. For example, a piezoelectric wafer or wafer assembly could be attached directly to the base of the dish. With the driver 12 in operation, expansion and contraction of the piezoelectric wafers 18 causes the end 22 of the piston to vibrate along its axis, with the driver in the resonant mode.

The dish 10 is preferably flat or concave and is symmetrical about a central longitudinal axis, with an outer circular perimeter. The dish 10 also has one or several resonant frequencies which are preferably selected to correspond to the operational or resonant frequency of the driver 12. For the production of high frequencies, the dish is typically made from a fatigue resistant metal. The wall thickness and construction of the dish is designed such that the dish has a flexural mode of vibration which is symmetrical about its axis to produce intense sound. The dish is preferably designed to minimize other modes of vibration, such as wave propagation in a circular path, which is common in a gong or bell. The outer diameter of the dish is preferably greater than about two wavelength (in air) of the sound to be produced, and the diameter may be greater than the diameter of the driving element or means.

Conventional sound sources are highly inefficient because they have a high acoustic impedance relative to the impedance of air, and power is lost or absorbed by the device rather than being converted to sound. Conventional sound sources use direct radiating surfaces akin to a reciprocating piston having a limited surface area and/or limited travel, which impose a limit on available intensity.

Figure 2:
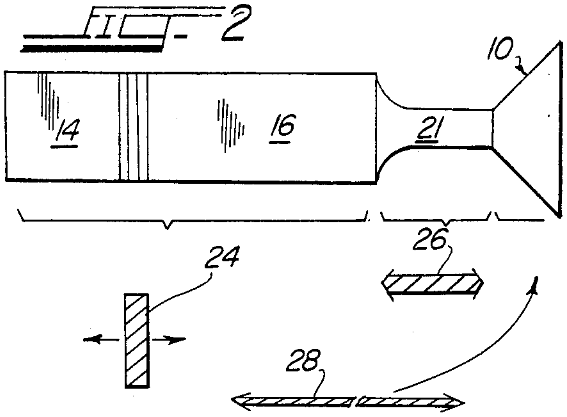
FIG. 2 is a highly schematic view showing the transformation of force and motion of the transducer of the present invention.

As shown in FIG. 2, the transducer of the present invention utilizes stages of mechanical transformation by which the impedance of the device is more closely matched to the impedance of air and maximum acoustic power is transmitted. As schematically shown by the arrows in FIG. 2, (where force is vertically represented and motion is horizontally represented), the force produced by the piezoelectric wafers at 24 is extremely high while the movement is very small, resulting in extremely high impedance. Reduction in the cross section of the piston from 24 to 26 allows the end of the piston to travel a greater distance, but with less force, such that impedance is reduced. The dish 10, in turn, is driven by the piston, creating traveling flexural waves that propagate radially and are reflected from the boundary of the dish to produce a standing wave pattern. At resonance, this standing wave pattern produces motion which is greater at the periphery than at the center, as shown schematically by the dotted lines in FIG. 3. Such large amplitude motion results in a further reduction of impedance at 28 (FIG. 2) and hence improves the acoustic coupling to the air. As a result, focused sound intensities in excess of 170 db are easily attained. It will be appreciated that while the dish 10 is preferably concave, it does not function as a horn but as a flexing diaphragm or direct radiator acting against the air, and the flexing allows for additional displacement that would not be available, for example from a solid or inflexible piston.

Figure 3:
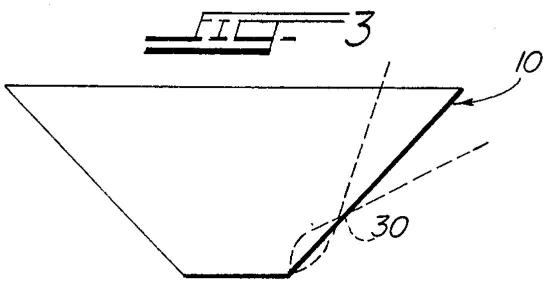
FIG. 3 is a schematic sectional view showing the flexure of the dish illustrated in FIG. 1.

FIG. 3 is a representation of the walls of a dish at its first bending resonance. It will be noted that the amplitude of vibration (indicated by the dotted lines) is small at the base compared to the amplitude near the outer edge beyond the nodal point 30.

As stated previously, maximum efficiency is attained if the dish is caused to flex or vibrate at its natural resonant frequency, although the device is operable and provides benefits at other frequencies. The efficiency and optimum frequency or frequency range of the dish is determined by a number of interrelated factors such as mass, stiffness and composition of materials employed, base and wall thickness, diameter depth and the like. The angle of the dish strongly affects stiffness and hence the frequency of resonance. The wall angle also determines the focusing effect, and such angle may very from flat to about 30 degrees of less relative to the central axis of sand propagation.

Figure 4:
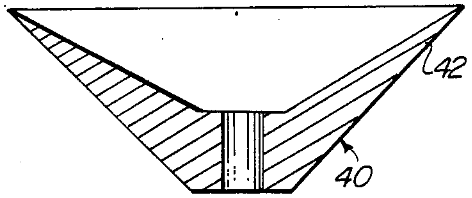
FIGS. 4, 5 and 6 are vertical sectional views of various dish configurations which may be used in conjunction with the transducer of the present invention.
Figure 5:
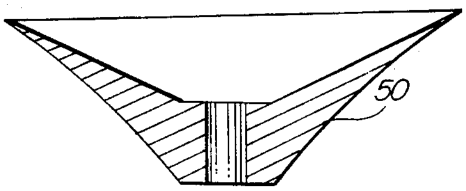
Figure 6:
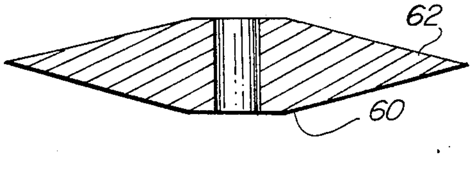

Various forms of dishes are shown in FIGS. 4, 5 and 6. As shown in FIG. 4, the dish includes a thick base portion 40 and a concave hollow conical portion 42 with a divergent wall that tapers uniformly toward the outer edge.

The dish shown in FIG. 5 is similar in construction to the one shown in FIG. 4, except the outer conical surface 50 is concave, resulting in the outer edge having a thinner cross section.

As shown in FIG. 6, the dish may be relatively flat rather than conical and may include a base 60 and disc 62 extending around the base and having an outwardly tapering cross section. It may be seen that this configuration allows for maximum amplitude of vibration at the periphery with minimum stress in the material.

Obviously, many other configurations are available and may be successfully employed. The thinner section near the outer perimeter is preferred to reduce tensile forces and to allow maximum bending amplitude.

The angle of divergence of the dish relative to the central axis may also be varied. Generally, a flatter dish such as shown in FIG. 6, will tend to produce a wide beam of sound. A dish having less divergent walls, such as the one shown in FIGS. 4 and 5, will produce sound waves which are focused or more concentrated at a location along or near the central axis of the dish.

FIG. *7a* is a representation of a typical sound pattern produced by a dish such as those shown in FIGS. 1, 4 and 5. It may be seen that the primary sound pattern 70 produced by the dish 10 is in the form of a column or beam of high intense and coherent sound. This beaming effect is very useful in many applications, including acoustic levitation as hereinafter described.

FIG. *7b* is a graphical representation shown in FIG. *7b*. It will be noticed that the majority of the sound is within the beam 70, which is or may be focused at a distance from the dish.

FIG. 8 illustrates another embodiment of a sound source having a different form of intermediate transformer. A large diameter stub 80 and layers of piezoelectric wafers 82 are connected to the solid base 83 of a hollow horn 84. The outer wall 86 of the horn is cylindrical, and the inner wall 88 slopes outwardly from the base from a relatively thick cross section at the base 83 to a thin cross section at the other open end 89. The open end 89 is coupled to a sound radiating flexural dish 85 as described in the previous embodiments.

FIG. 9 shows yet another form of dish in the form of an elongated concave trough 90, which may be of any length and is capable of producing an elongated band of sound. The trough 90 may be driven by one or a plurality of drives, such as the piezoelectric slabs 92 in contact with the base of the dish.

With reference to FIG. 10, the sound source 100 of the present invention is shown in connection with a reflector 102. The reflector 102 may be large relative to the wavelength of the sound being employed and may be spaced at a distance from the dish such that a standing wave is produced. In the alternative, the reflector may be smaller in diameter in accordance with U.S. Pat. No. 4,284,403 to produce localized interference near the reflector. In either event, one or more so-called energy wells are produced between the sound source and reflector in which the potential acoustic energy is at a minimum. In such regions, objects as 104 may be stably positioned and suspended.

In the example shown in FIG. 10, the reflector 102 is spaced from the sound source at a distance of n/2 away, wherein is the sound wavelength, and n is an integer. A standing wave is established between the sound source and reflector, which define planes of minimum pressure 106, which are spaced apart a distance n/2. It may be seen that a more intense sound source will provide more sharply defined planes of minimum pressure, or conversely, greater acoustic pressure around the levitated object to retain it in an axial direction.

In conjunction with the levitation apparatus shown in FIG. 10, the apparatus may be installed in a gas tight chamber 108, and conventional means, generally indicated at 109, such as a pump, may be employed to pressurize the chamber above normal atmospheric pressure. An increase in pressure allows for much higher intensity of sound forces to be exerted on the levitated object 104 for the same vibrational amplitude of the sound source. Conventional apparatus is available for pressurization of up to about 100 atmospheres, although other types of equipment are capable of considerably higher pressures and may be used in conjunction with acoustic levitation.

In addition, means, such as a conventional heater 110, laser, or the like, may be used to heat the chamber 108 and/or the object 104 while it is being levitated and out of contact with a container. The benefits of containerless melting are described in the aforesaid U.S. Pat. No. 4,258,403.

The sound source of the present invention offers several advantages in connection with acoustic levitation devices. First, the device is more efficient than comparable devices and therefore consumes less power per unit of sound intensity. This is an important factor for acoustic positioning in space, where available power resources are limited.

A second advantage of the sound source of the present invention is the capability of producing more intense sound than devices heretofore available, i.e., in excess of 170 dB. The focusing effect in the area of levitation greatly increases the maximum intensities obtainable because the harmonic generation due to nonlinearities in the gas is significantly reduced, and shocking-up is minimized. This increased sound intensity, in turn, enables the stable levitation of relatively dense objects even against the forces of gravity. The lower sound intensities available from prior art devices allowed levitation of only very small objects or objects of very low density. The higher intensity along the axis of propagation of the source of the present invention results in considerably higher acoustical forces on the levitated object, as discussed above.

Third, since the sound originating from the source is in the form of a column, as contrasted to, for example, a broad radiation pattern, the levitated object is constrained more stably against lateral movement away from the axis. Lateral stability in acoustic levitation devices is caused by a combination of the near field pressure of the sound source and the standing wave or interference wave pattern, which together define zones or bands of pressure minima along the axis. By the use of a concentrated or focused sound beam, these minimal pressure zones are made stronger and better defined. As a result, the forces available to restrain sideways or lateral movement of the levitated object are considerably greater.

We claim:

1. A transducer for producing sound of high intensities in a gas, said transducer comprising a concave dish having a base and a conical wall extending outwardly from the base, said conical wall tapering to the outer perimeter of said dish around the central axis thereof, said dish being flexible at the frequency of sound to be produced, and vibrating drive means connected to the base of said dish for flexing said dish along said axis from the base outwardly toward the perimeter, the impedance of the vibrating drive means being matched to the impedance of the base of the dish, and the outer perimeter of said dish producing exaggerated vibrating motion in comparison with the vibratory motion of the driver to provide an improved acoustic match with the gas.

2. The transducer of claim 1 wherein said dish has at least one resonant frequency and is vibrated at said resonant frequency.

3. The transducer of claim 1 wherein the outer periphery of the dish is circular.

4. The transducer of claim 3 wherein the dish is symmetrical about said central axis.

5. The transducer of claim 1 wherein the dish is in the form of a trough.

6. The transducer of claim 1 wherein said vibratory drive means comprises a piston, having an axis, and means for vibrating said piston along said axis.

7. The transducer of claim 1 wherein said gas is pressurized.

8. The transducer of claim 5 wherein said piston comprises a first portion and a second portion, said second portion being connected to said dish and having a diameter smaller than said first potion, said means for vibrating said piston being connected to said first portion.

9. The transducer of claim 1 wherein a horn is provided between said vibrating drive means and said dish.

10. The transducer of claim 5 wherein said piston is driven at its resonant frequency, which is the same as the resonant frequency of the dish.

11. The transducer of claim 1 in combination with an acoustic levitation device comprising a reflective surface spaced from said dish to enable an object to be levitated between said reflective surface and said dish.

12. The transducer of claim 11 wherein said gas is pressurized.

13. Method of producing sound waves along a longitudinal axis comprising the steps of disposing a flexible concave dish in a sound transmitting medium with the outer perimeter of the dish being unsupported, coupling a vibratory drive force to a central base portion of the dish, with the impedance of the vibrating drive force being matched to the base portion of the dish, and driving said force at the resonant frequency of the dish to produce exaggerated tensile bending motions near the outer perimeter of the dish to produce sound waves in the transmitting medium at said resonant frequency whereby the impedance of the drive force is more closely matched to the impedance of the transmitting medium.

14. The method of claim 13 comprising placing a reflective surface in a spaced relation with said dish, and acoustically levitating an object therebetween.

15. The method of claim 13 wherein said sound transmitting medium is pressurized.

16. The method of claim 14 wherein said sound transmitting medium is pressurized.

17. The method of claim 14 comprising the additional step of heating said object.

* * * * *